United States Patent
Kim et al.

(10) Patent No.: US 11,372,052 B2
(45) Date of Patent: Jun. 28, 2022

(54) JIG PRESSING-TYPE PRESSING SHORT-CIRCUITING INSPECTION METHOD

(71) Applicant: LG CHEM, LTD., Seoul (KR)

(72) Inventors: Sung Tae Kim, Daejeon (KR); Nak Gi Sung, Daejeon (KR); Joon Sup Kang, Daejeon (KR)

(73) Assignee: LG ENERGY SOLUTION, LTD., Seoul (KR)

(*) Notice: Subject to any disclaimer, the term of this patent is extended or adjusted under 35 U.S.C. 154(b) by 0 days.

(21) Appl. No.: 17/057,544

(22) PCT Filed: Nov. 15, 2019

(86) PCT No.: PCT/KR2019/015703
§ 371 (c)(1),
(2) Date: Nov. 20, 2020

(87) PCT Pub. No.: WO2020/105976
PCT Pub. Date: May 28, 2020

(65) Prior Publication Data
US 2021/0190874 A1    Jun. 24, 2021

(30) Foreign Application Priority Data
Nov. 21, 2018    (KR) .................. 10-2018-0144437

(51) Int. Cl.
*G01R 31/3835*    (2019.01)
*G01R 31/364*    (2019.01)
(Continued)

(52) U.S. Cl.
CPC ....... *G01R 31/3835* (2019.01); *G01R 31/364* (2019.01); *G01R 31/52* (2020.01); *H01M 10/4285* (2013.01)

(58) Field of Classification Search
CPC .. G01R 31/3835; G01R 31/364; G01R 31/52; G01R 19/00; G01R 19/165; G01R 31/36;
(Continued)

(56) References Cited

U.S. PATENT DOCUMENTS

2001/0019270 A1    9/2001    Onishi et al.
2007/0212601 A1    9/2007    Sakamoto et al.
(Continued)

FOREIGN PATENT DOCUMENTS

CN    108054455 A    5/2018
JP    2001-236985 A    8/2001
(Continued)

OTHER PUBLICATIONS

International Search Report issued in PCT/KR2019/015703 (PCT/ISA/210), dated Mar. 3, 2020.

*Primary Examiner* — Farhana A Hoque
(74) *Attorney, Agent, or Firm* — Birch, Stewart, Kolasch & Birch, LLP (57) ABSTRACT

A jig pressing-type pressing short-circuiting inspection method includes the steps of: pre-aging battery cells, each of which is manufactured by inserting an electrode assembly in a battery container, injecting an electrolyte into the battery container, and sealing the battery container. The method includes inserting the plurality of battery cells in an active jig; pressing the active jig; and inspecting electric current of the battery cells. The inspection method permits detection of a low-voltage defect of a battery cell in a pre-aging state, which shows a high voltage regulation per capacity, thus greatly reducing the inspection time, and enabling simultaneous inspection of a plurality of battery cells. In addition, a micro-defect occurring in a stack-folding type battery cell can be accurately detected, which is difficult to be detected by the conventional inspection method.

16 Claims, 7 Drawing Sheets

(51) Int. Cl.
   *G01R 31/52* (2020.01)
   *H01M 10/42* (2006.01)
(58) Field of Classification Search
   CPC  G01R 31/50; G01R 19/003; G01R 19/16571;
                    H01M 10/4285; H01M 4/04; H01M
                    10/42; H01M 10/482; H01M 4/0447;
                                                        Y02E 60/10
   USPC .......................................................... 324/548
   See application file for complete search history.

(56) References Cited

U.S. PATENT DOCUMENTS

2009/0146663 A1      6/2009   Takeno et al.
   2010/0244847 A1*     9/2010   Kudo .................... B60L 3/0069
                                                                324/433
   2014/0123472 A1*     5/2014   Iwase ................ H01M 10/0468
                                                                 29/593
   2016/0126758 A1*     5/2016   Wu ....................... H02J 7/0031
                                                                320/162
   2016/0161564 A1*     6/2016   Kurihara ............. H01M 10/446
                                                                324/426
   2018/0047961 A1*     2/2018   Igawa ...................... H01G 9/02

FOREIGN PATENT DOCUMENTS

JP            2007-35306 A       2/2007
   JP           2007-242320 A       9/2007
   JP           2010-153275 A       7/2010
   JP           2010-231948 A      10/2010
   JP            2012-84332 A       4/2012
   JP            2014-93270 A       5/2014
   JP            2017-40633 A       2/2017
   KR        10-2009-0060186 A      6/2009
   KR        10-2014-0138383 A     12/2014
   KR        10-2016-0024980 A      3/2016
   KR        10-2016-0068244 A      6/2016
   KR        10-2017-0062402 A      6/2017
   KR        10-2017-0095013 A      8/2017
   KR        10-2018-0082759 A      7/2018
   KR           10-1896218 B1       9/2018

* cited by examiner

JIG PRESSING-TYPE PRESSING SHORT-CIRCUITING INSPECTION METHOD

TECHNICAL FIELD

This application claims the benefit of priority based on Korean Patent Application No. 10-2018-0144437, filed on Nov. 21, 2018, and the entire contents of the Korean patent application are incorporated herein by reference.

The present invention relates to a pressure short circuit inspection method of the jig pressing type, and more particularly, to a pressure short circuit inspection device, for a large amount of battery cells, capable of identifying a low voltage failure due to a separator defect which may be occur at the time of assembling an electrode assembly.

BACKGROUND ART

As the price of energy sources increases due to depletion of fossil fuels and the interest in environmental pollution increases, the demand for environmentally friendly alternative energy sources becomes an indispensable factor for future life. Especially, as technology development and demand for mobile devices are increasing, demand for secondary batteries as energy sources is rapidly increasing.

Typically, in terms of the shape of the battery, there is a high demand for a prismatic secondary battery and a pouch-type secondary battery that can be applied to products such as mobile phones with a small thickness. In terms of materials, there is a high demand for lithium secondary batteries such as lithium ion batteries and lithium ion polymer batteries having high energy density, discharge voltage, and output stability.

The secondary battery is classified according to the structure of the positive electrode, the negative electrode, and the electrode assembly having the structure of a separator interposed between the positive electrode and the negative electrode. Some examples thereof include a jelly-roll type (wound type) electrode assembly in which positive electrodes and negative electrodes of a long sheet type are wound with a separator interposed therebetween, a stack-folding type electrode assembly of a structure in which unit cells, such as bi-cells or full cells, stacked with positive and negative electrodes of a predetermined unit laminated through a separator, are wound, etc.

In addition, the secondary battery is manufactured by injecting an electrolyte, which is a liquid electrolyte, in a state where the electrode assembly is accommodated in the battery container, and sealing the battery container.

A secondary battery that has been manufactured may have various defects due to various causes during an assembly process, a manufacturing process, or use. Among these, a phenomenon in which a manufacture-completed battery shows a voltage drop behavior higher than a self-discharge rate is referred to as low voltage.

Such low voltage failures are often caused by metal foreign matters located inside the battery. Typically, when foreign metals exist in the positive electrode, the foreign metals grow as a dendrite at the negative electrode, and the dendrite causes an internal short circuit of the secondary battery. As a result, an internal short circuit of the secondary battery causes failure, damage, or ignition of the secondary battery.

In particular, low voltage failures often occur during assembly of secondary batteries. Types of assembly defects that cause low voltage include separator damage, such as separator tearing, separator folding, and separator puncture. Such separator damage occurs mainly at four corners of the cell body during the battery manufacturing process.

Although the above defects may cause an internal short circuit, that is, a short that is a contact between the positive electrode and the negative electrode, such a contact has not yet occurred due to the thickness of the separator, but since a short may occur at any time, it is necessary to internal-short-circuit the portion by pressurizing the portion to recognize the defect.

Defects in the assembly process are generally detected through vision inspection, thereby determining the defect of the battery cell. However, in the case of a stack-folding type battery cell, assembling defects generated during the folding process due to the characteristics of the stacking-folding process cannot be easily distinguished through vision inspection due to defects in the folding cell.

On the other hand, in order to detect the short resulting from the metal foreign material, a jig having a shape corresponding to a Chinese character (田) for field was used. After storing the battery cell in the jig, a method of detecting a low voltage through a HI-POT test while pressing the body portion of the cell is used. However, the jig having a shape corresponding to a Chinese character for field (田) has a problem that it is difficult to accurately inspect because the pressure to press the cell is not enough to generate a short circuit at a separator defect portion that can occur in the assembly process.

Korean Patent Publication Nos. 10-2016-0068244 and 10-2014-0138383 disclose an apparatus and a method for screening defects of an electrode assembly. Specifically, a technology of placing an electrode assembly on a base plate, pressing a top surface of the electrode assembly with a jig, and simultaneously applying a current to induce an internal short circuit is disclosed.

However, the proposed technology relates to a device and method about a single battery cell, and it is difficult to inspect a large amount of cells in a short time. Further, the proposed technology has a limitation in that the principle of checking whether the electrode assembly is shorted by applying a current is not described in detail. In addition, when pressurizing the electrode assembly in which the electrolyte is not injected, there is a problem that it is difficult to accurately determine the defect due to the high mechanical stiffness which makes it difficult to contact the interface between the positive electrode and the negative electrode against pressure.

In addition, conventionally, a technology of determining a defect based on a voltage drop value through voltage measurement has been mainly used for a defect inspection. However, there was a problem such that it took at least 30 minutes to know the test result.

Therefore, in order to solve the above problems, it is necessary to develop a detection method and apparatus for fast and accurate low voltage failure screening for a large number of battery cells.

DISCLOSURE

Technical Problem

It is an object of the present invention to solve the above-mentioned problems of the prior art and the technical problems required from the past.

An object of the present invention is to identify a low voltage failure due to a separator defect generated in the assembly process other than foreign materials, which was difficult to be detected by the existing low voltage failure screening method, and to provide a method capable of performing inspection in a short time by applying a pressure short circuit inspection of the jig pressing scheme to a large number of uncharged battery cells.

Still another object of the present invention is to provide a pressure short circuit inspection device capable of inspecting a plurality of battery cells at a time without interfering with production speed and without an additional equipment by utilizing an activation jig conventionally used for pressure short circuit inspection.

However, the objects of the present invention are not limited to the above-mentioned object, and other objects not mentioned will be clearly understood by those skilled in the art from the following description.

Technical Solution

A method for inspecting a short circuit for detection of a low voltage failure cell according to the present invention includes: a step of accommodating an electrode assembly in which a positive electrode and a negative electrode are stacked in a battery container with a separator interposed therebetween and then injecting an electrolyte and pre-aging a plurality of battery cells in which the battery container is sealed (S100); a step of accommodating the plurality of battery cells in an activation jig (S200); a step of pressing the activation jig (S300); and a step of inspecting current of the battery cells (S400).

In an embodiment of the present invention, the method may be performed before a first formation process.

In an embodiment of the present invention, the method may further include measuring an open circuit voltage (OCV) of the battery cell before, during or after pressing the activation jig (S300).

In an embodiment of the present invention, the step of inspecting the battery cells (S400) may include: a step of applying a constant voltage to the battery cell (S410); and detecting a separator defect by measuring a leakage current (S420). At this time, the range of the applied voltage may be from an open circuit voltage of the battery cell to the open circuit voltage of the battery cell+500 µV, preferably from the open circuit voltage of the battery cell to the open circuit voltage of the battery cell+50 µV.

In an embodiment of the present invention, the step of detecting the separator defect (S420) may include measuring the leakage current for 2 to 10 seconds.

In an embodiment of the present invention, it may be determined that there is a separator defect when an average value of the measured leakage current exceeds 0.08 mA, and the separator defect may include a tearing, a folding or a puncture of the separator.

In an embodiment of the present invention, the area of the tearing of the separator may be greater than 0 mm$^2$ and less than 26.0 mm$^2$, more specifically greater than 2.0 mm$^2$ and less than 4.5 mm$^2$.

In an embodiment of the present invention, in the step of pressing the activation jig (S300), the pressing force is between 1 MPa to 5 MPa, more preferably between 2.83 MPa to 3.34 MPa.

In an embodiment of the present invention, the method for inspecting a short circuit by pressurization may be applied to pouch-type secondary battery cells.

In an embodiment of the present invention, the step of pressing the activation jig (S300) may include pressing the battery cell by a pressure pad attached to the activation jig, and a portion where the pressure pad contacts the battery cell may be an edge portion of a body part of the battery cell.

In an embodiment of the present invention, a state of charge (SOC) of the battery cell to be inspected may be 10% or less.

Advantageous Effects

According to the pressure short circuit inspection method of the jig pressurization type for the detection of low voltage failure cells of the present invention, since the battery cells with SOC 10% or less with a large voltage change rate per capacity are inspected, the time required to reach the applied voltage may be greatly shortened, and low voltage failure cells generated due to a separator defect may be detected within a few seconds or several tens of seconds.

In addition, the inspection method of the present invention is carried out at the point when the mechanical stiffness is reduced as the electrode/separator/binder absorbs the electrolyte by the pre-aging process, which is advantageous for the interface contact between the positive electrode and the negative electrode. Hence, there is an advantage in that it is possible to accurately detect defects of fine levels of several to several tens of mm$^2$ generated in the folding process, which were difficult to be detected by the conventional inspection method.

In addition, since the inspection device used in the inspection method of the present invention can utilize an activation jig for activating a plurality of battery cells, it is possible to perform the pressure short circuit inspection for a large amount of battery cells, thereby reducing the inspection time.

In addition, the manufacture of additional equipment is not necessary by using the activation jig, and it is possible to perform the activation process (jig formation) immediately after removing the pressure pad after the inspection, thereby not decreasing the battery production speed.

DETAILED DESCRIPTION OF THE PREFERRED EMBODIMENTS

The terms and words used in the present specification and claims should not be construed as limited to ordinary or dictionary terms and the inventor may properly define the concept of the terms in order to best describe its invention. The terms and words should be construed as meaning and concept consistent with the technical idea of the present invention. Accordingly, the embodiments described in the specification and the configurations described in the drawings are only the most preferred embodiments of the present invention, and do not represent all of the technical ideas of the present invention. It is to be understood that there may be various equivalents and variations in place of them at the time of filing the present application.

Also, throughout the specification, when an element is referred to as "including" an element, it is understood that the element may include other elements as well unless specifically stated otherwise.

As used throughout this specification, the terms "about", "substantially", and the like, are used to mean a value or something like this when unique manufacturing and material tolerances are presented, and the terms are used to prevent unscrupulous infringers from unfair use of the disclosure including accurate or absolute figures in order to aid in the understanding of the present disclosure.

Throughout this specification, the term "combination(s) thereof" included in the expression of the Markush form means one or more mixtures or combinations selected from the group consisting of the elements described in the Markush form representation, and it means to include one or more selected from the group consisting of the above components.

Throughout this specification, the expression "A and/or B" means "A or B or both."

Hereinafter, the present invention will be described in detail.

In the secondary battery, a positive electrode, a negative electrode, and an electrode assembly having a separator interposed between the positive electrode and the negative electrode are manufactured. The electrode assembly is accommodated in a battery container together with an electrolyte and assembled into a battery cell.

Low voltage failure may occur due to various defect forms that may occur during the assembly process in which the electrode assembly is manufactured. Specifically, the types of assembly defects that cause low voltage include folding of separator, tearing of separator, and puncture of separator.

In particular, in the case of a stack-folding battery cell, the above-described separator defects that occur while folding are easily generated due to the characteristics of the assembly process. However, in the case where the above-described separator defects exist inside the stack-folding battery cell, there is a limitation that it is difficult to accurately perform inspection by using the vision inspection conventionally used for detecting defects caused by foreign substances.

In addition, according to the conventional method for inspecting a low-voltage failure by foreign materials, a HI-POT test was performed while pressing the body part of the cell using a jig having a shape corresponding to a Chinese character for field (田) for detection of an internal short circuit which may be caused by foreign materials. However, the jig as described above has a limitation in that it is difficult to accurately perform inspection because it is difficult to generate a short at a portion with separator defects which are generated during the assembly process due to lack of force of pushing the cell of the jig.

Accordingly, the present invention discloses a pressure short circuit inspection method for detecting a low voltage failure through a pressure short circuit inspection of a battery cell in a pre-aging step in order to solve the above problems.

Hereinafter, the pressure short circuit inspection method by jig pressure will be described.

The pressure short circuit inspection method according to an embodiment of the present invention includes:

Accommodating an electrode assembly in which a positive electrode and a negative electrode are stacked in a battery container with a separator interposed therebetween and then injecting an electrolyte and pre-aging a battery cell in which the battery container is sealed (S100);

accommodating the plurality of battery cells in an activation jig (S200);

pressing the activation jig (S300); and inspecting current of the battery cell (S400).

Figure 2:
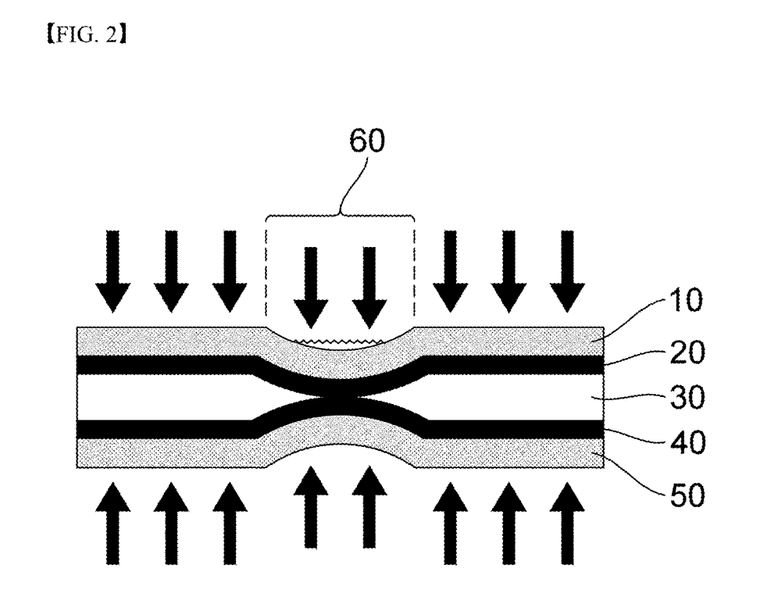
FIG. 2 is a schematic diagram showing an internal short-circuit structure by battery cell pressurization.

FIG. 2 is a schematic diagram of causing an internal short circuit of a battery cell by pressure. Referring to this, the positive electrode and the negative electrode are directly contacted by the pressurization in a defective part of the separator, thereby causing an internal short circuit.

According to the pressure short circuit inspection method of the present invention is as follows, by pressurizing the battery cell as described above, the positive electrode and the negative electrode of the part where the separator is physically damaged are made to be physically contacted to be electrically connected. When a constant voltage of a predetermined range is applied to such a battery cell, a leakage current is generated to maintain the applied voltage in the short-circuited battery cell. Since the measured current value of the short-circuited battery cell is inevitably larger than that of the normal cell due to the leakage current, it is determined that the battery cell whose measured current value exceeds a predetermined reference current value after application of the constant voltage is defective.

The pressure short circuit inspection method of the present invention is characterized by inspecting a battery cell close to a discharge state with SOC of 10% or less.

Figure 1:
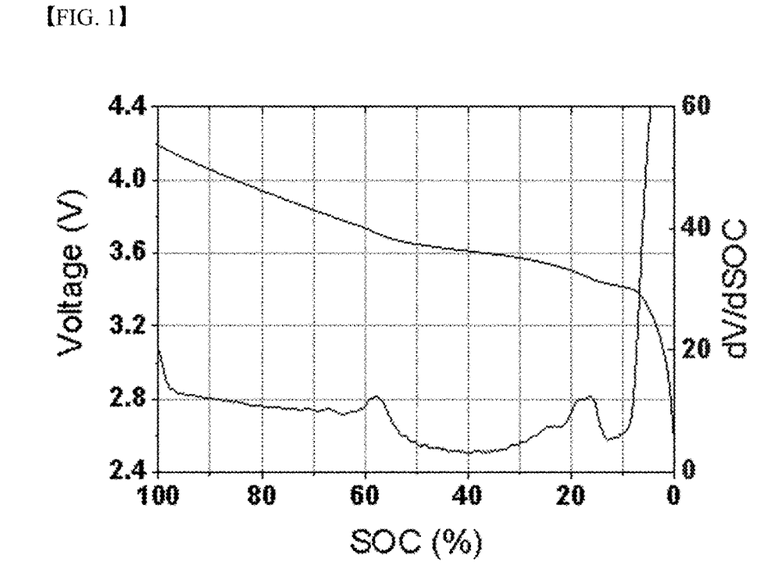
FIG. 1 is a graph showing the voltage and the rate of change of voltage according to the charge and discharge capacity (SOC) of the battery.

FIG. 1 is a graph showing the voltage and the rate of change of voltage per capacity according to SOC when a specific battery cell is discharged with a C-rate of 0.02 C. Referring to this, it can be seen that the voltage change rate per capacity (dV/dSOC) in the area where SOC is 10% or less is significantly larger than in other sections. This means that when a voltage is applied to a battery cell having an SOC of 10% or less, the time for reaching the applied voltage is drastically shortened. Therefore, in the short circuit inspection method of the present invention, when a constant voltage is applied to the battery cell, the applied voltage is reached within a few seconds or several tens of seconds. As such, it is possible to determine whether the battery cell is defective from the current value measured within a few seconds to several tens of seconds after applying the voltage, thereby significantly reducing the time required for detecting the defective cell.

Therefore, the pressure short circuit inspection method of the present invention is preferably performed before the first formation process. The formation process is a process of charging and activating a battery cell in a discharged state, and the battery cell may be charged with SOC about 10 to 40%, but the present invention is not limited thereto and various forms of known formation processes can be used.

The inspection method of the present invention is performed before the first formation process in order to significantly reduce the time required for detection of defective cells and to detect even minute separator defects.

When the secondary battery cell pouch is charged during the first formation process, a gas and an SEI film having electrically non-conductive properties are formed at the interface of the electrode, which causes an increase in contact resistance between the positive electrode and the negative electrode, making it difficult to detect minute separator defects. Therefore, the inspection method of the present invention is preferably performed before the primary formation process.

In addition, the inspection method of the present invention is characterized in that it is performed at the time when the wetting of the electrolyte becomes sufficient by the pre-aging step or the pre-aging. As described above, the inspection method of the present invention allows the positive electrode and the negative electrode to be in physical contact with each other at the defective part of the separator through pressurization. As such, when the electrolyte is sufficiently absorbed by the electrode/separator/binder, their mechanical stiffness is reduced, which is much more advantageous for the interface contact between the positive electrode and the negative electrode. Therefore, when the inspection method of the present invention is performed during the pre-aging step or when the pre-aging has been completed, it is more effective for detecting defects caused by minute separator defects.

The battery cell of the pre-aging step (S100) may be manufactured as follows. First, an electrode mixture including an electrode active material and a binder is applied to an electrode current collector to prepare a positive electrode and a negative electrode, respectively, and then an electrode assembly is prepared by interposing a separator between the positive electrode and the negative electrode. Thereafter, after manufacturing the electrode assembly in a battery container, an electrolyte is injected and the battery container is sealed to thereby manufacture a battery cell. Herein, a pre-aging process is carried out so that the electrolyte is sufficiently impregnated in the electrode/separator/binder.

The electrode assembly may be a jelly-roll (wound) electrode assembly, a stacked (laminated) electrode assembly, a stack-folding electrode assembly, and the like. Even in a stack-folding electrode assembly, which is difficult to detect a defect by a conventional method, even a minute separator defect can be detected by the inspection method of the present invention.

The battery container that is commonly used in the related art may be adopted, and there is no limitation on the appearance according to the usage of the battery, but a battery in which pressure due to pressurization can be transferred to the electrode assembly well, such as a pouch-type battery, is preferably applied to the test method of the present invention because the battery container is flexible In the pre-aging step, the battery cell may be stored for 0.5 to 72 hours at room temperature and atmospheric pressure so that the electrolyte can be permeated into the positive electrode and negative electrode well. The room temperature may be carried out, for example, a temperature of 20 to 30° C., preferably 22 to 28° C., more preferably 23 to 27° C., and most preferably 25 to 27° C., but it is not limited to these examples and various forms of known pre-aging processes can be used.

Next, a step (S200) of accommodating the plurality of battery cells having undergone the pre-aging process, in the activation jig is performed. The activation jig is a device designed to simultaneously press a large number of battery cells, and may include a connection unit for connecting an external power system for applying voltage and/or a measuring device for measuring current to the activation jig.

Hereinafter, the activation jig of the present invention will be described in detail.

Figure 6:
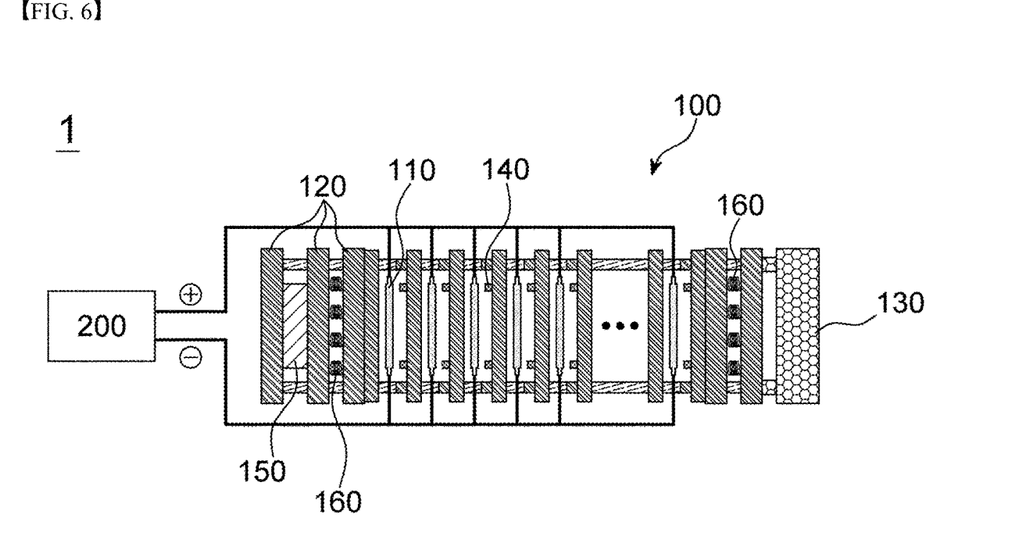
FIG. 6 is a schematic diagram showing a pressure short circuit inspection device 1 of the present invention.
Figure 7:
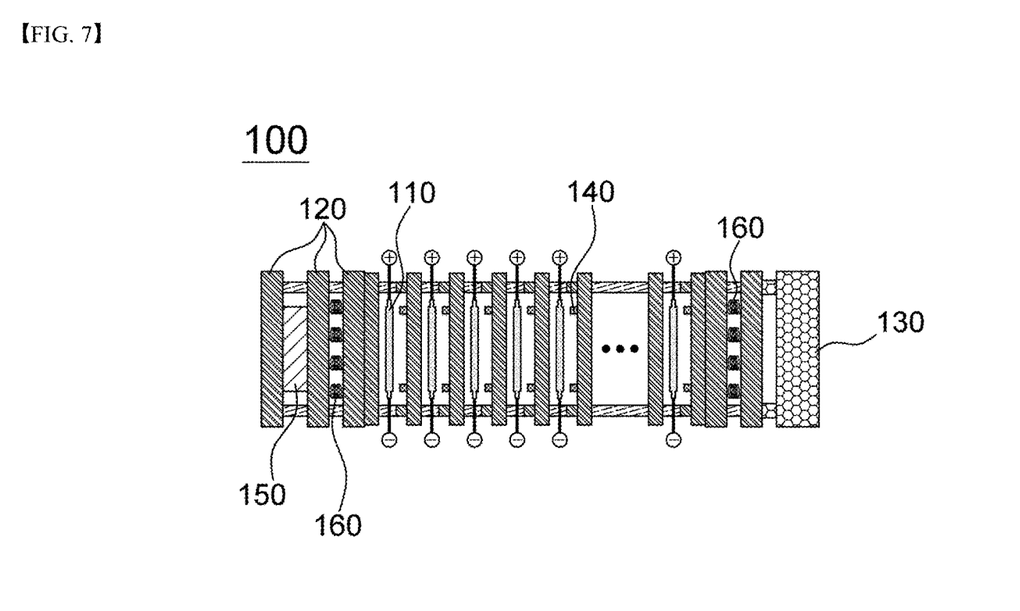
FIG. 7 is a schematic view showing an activation jig 100 of the present invention.

FIG. 6 is a schematic diagram showing a pressure short circuit inspection device 1 including an activation jig 100 and a current inspection equipment 200 according to an embodiment of the present invention, and FIG. 7 is a schematic view showing an activation jig 100 according to an embodiment of the present invention. Referring to FIGS. 6 and 7, the activation jig 100 is a device which has a plurality of battery cells 110 mounted thereon and pressurizes the battery cells 110. The activation jig 100 includes: a plurality of plates 120 on which a large amount of battery cells 110 are mounted; a pressure driving unit 130 for applying pressure to one surface of the plate; a load cell 150 for measuring the pressure applied to one end of the plate; and a spring 160 for relieving pressure.

The battery cell 110, the load cell 150, or the spring 160 is interposed at each of the spaces between the plates 120. Specifically, the plurality of plates 120 are arranged in a vertical line on the lower base plates (not shown), and the battery cell 110, the load cell 150, or the spring 160 may be positioned between the plates 120. Specifically, one side of the plate 120 has a load cell 150 mounted thereon, the other side of the plate 120 is in contact with the pressure driving unit 130, and the center of the plate 120 has battery cells 110 mounted thereon.

Among the plates, a plate for pressing the battery cell may have at least one surface having a pressure pad 140 attached thereon. The pressure pad may be attached to more effectively pressurize a portion of the battery cell where damage on the separator, such as tearing, folding, or puncture of the separator, is expected. The pressure pad may be attached on the activation jig for the pressure short circuit inspection of the present invention, and then the pressure pad may be detached from the activation jig for the subsequent process after the inspection is completed.

The load cell 150 is a device for detecting pressure by being mounted between the outermost plate and the plate adjacent thereto. In detail, the load cell measures pressure in kgf when the pressure is applied to the battery cell 110 existing between the plates by the pressure driving unit 150 to thereby apply an appropriate level of pressure. That is, it is a role of measuring the pressing force to determine a pressure by which the battery cell is not physically damaged. If the pressing force is too high, there is a problem that the electrode in the battery cell may be detached, or the appearance of the battery container may be damaged. On the other hand, if the pressing force is too low, the positive electrode and the negative electrode do not touch each other, so internal short circuit does not occur. Therefore, accurate defect inspection is not performed.

The pressure driving unit 130 is in contact with the outermost plate where the load cell 150 is not located. The pressure driving unit 130 is a device that applies pressure to one surface of the adjacent plate. Specifically, the pressure driving unit 130 induces a short circuit in the battery cell by pressing the battery cell 110 located between the plates. It is preferable that the shape of the pressure driving unit 130 is a planar shape, and the size may correspond to the plane of the plate.

The pressing force by the pressure driving unit may be appropriately selected in consideration of the thickness of the electrode assembly, the thickness of the pouch, the pressing time, the physical properties of the separator, etc., but is preferably 1 to 5 MPa, more preferably 2.83 to 3.34 MPa. If the pressing force is less than 1 MPa, it is difficult to detect a defect because the proper pressure is not applied to the battery cell, and if it is more than 5 MPa, damage may occur to the battery cell.

The spring 160 serves to relieve pressure, and is positioned between both end plates and an adjacent plate to relieve pressure on the battery cells mounted between the central plates. That is, the spring 160 may be positioned between the plate and an adjacent plate on which the load cell 150 is mounted and between a plate in contact with the pressure driving unit 130 and an adjacent plate, respectively.

Figure 8:
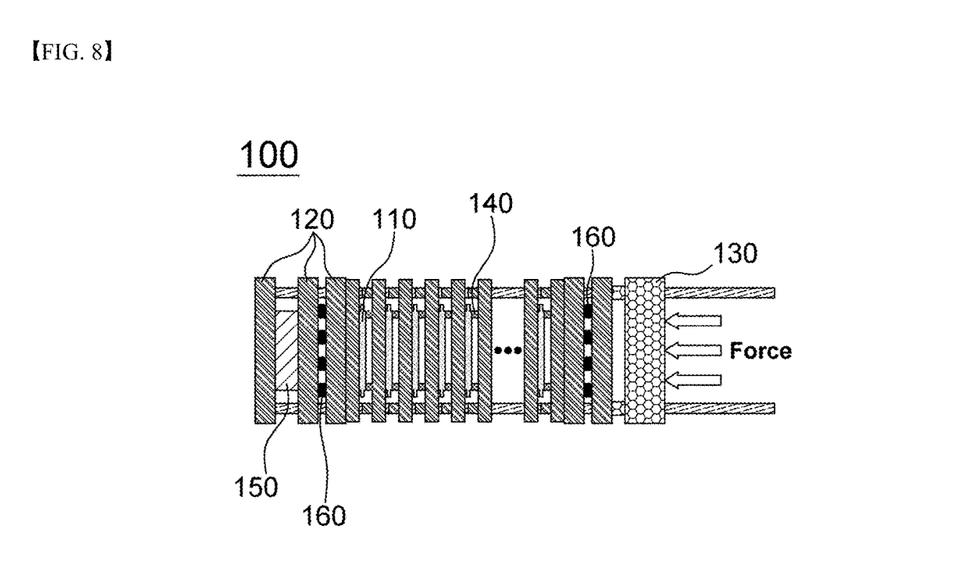
FIG. 8 is a schematic view showing a structure in which pressure is applied to the activating jig 100 of the present invention.

In the present invention, the jig pressurization is performed through the activation jig 100 having the configuration as described above. FIG. 8 is a schematic view showing a structure in which pressure is applied to the activating jig 100 of the present invention. Since the inspection method of the present invention uses the activation jig 100 capable of pressurizing a large amount of battery cells, it is possible to inspect a plurality of cells at a time, compared to conventionally pressurizing a single cell to check for low voltage failure. Hence, it is efficient in terms of time and money.

In the present invention, the activation jig used in the formation process can be utilized. It is possible to continually perform the formational process by attaching the pressing plate on the activation jig when performing the inspection method of the present invention by using the activation jig and detaching the pressing plate from the activation jig for the subsequent process after completing the inspection. Therefore, it is possible to carry out pressure short circuit inspection using existing activation equipment, which does not require additional equipment such as retrofit of existing equipment, and it is possible to inspect multiple cells at once without disturbing production speed.

Next, the step of pressing the activation jig is performed (S300).

FIG. 8 is a schematic diagram showing a process of pressurizing a battery cell by the activating jig 100 according to an embodiment of the present invention. Referring to this, when the battery cell 110 is mounted between the plates 120, the pressing plate 120 is advanced by the operation of the pressure driving unit 130 to decrease the distance between the pressing plates 120, to thereby pressurize the battery cell 110 at the same time. This pressure prevents the battery cell from insulating the positive electrode and the negative electrode when the internal separator is damaged.

At this time, the pressing force may be 1 MPa to 5 MPa, preferably 2.83 to 3.34 MPa. If the pressing force is less than 1 MPa, it is difficult to detect a defect because the proper pressure is not applied to the battery cell, and if it is more than 5 MPa, damage may occur to the battery cell.

When pressurizing the battery cell by using the activation jig 100, the battery cell may be pressurized by attaching a pressure pad 140 to the pressing plate 120. The pressure pad 140 may effectively press only a defective portion inside the battery cell, and prevent direct damage to the battery cell.

The pressure pad is preferably attached to the body corner of the battery cell, that is, the corresponding portion of the pressing plate capable of pressing the corner portion. This is because the separator defects mainly occur at the four corners of the battery cell body, and thus effectively pressurize the sites where the separator defects are likely to occur. By attaching a pressure pad to such a pressing plate to pressurize the battery cell, it is possible to effectively press the defect site where the tearing, folding and puncture of the separator may occur, and to induce a short circuit of the exposed electrode.

Figure 3:
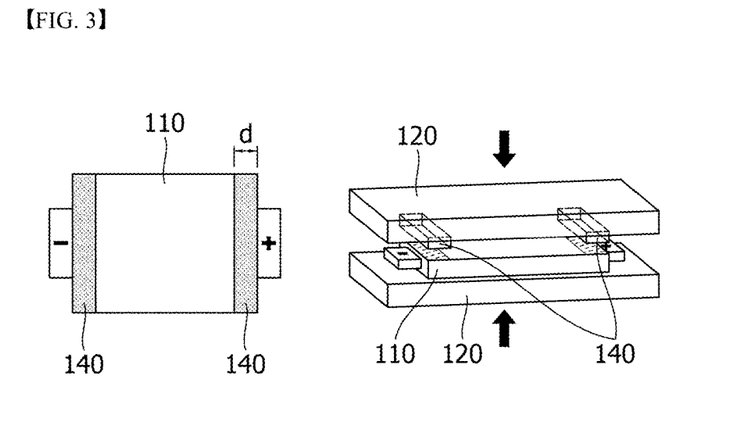
FIGS. 3 to 5 schematically show various embodiments in which the pressure pad of the activation jig of the present invention is attached and the concept of a pressure short circuit inspection of the present invention.
Figure 4:
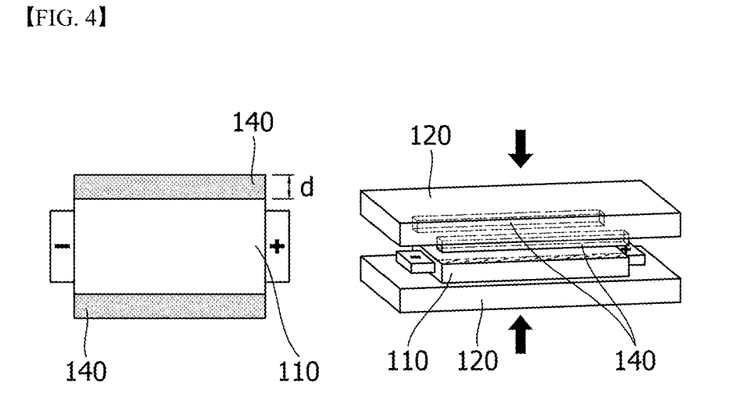
Figure 5:
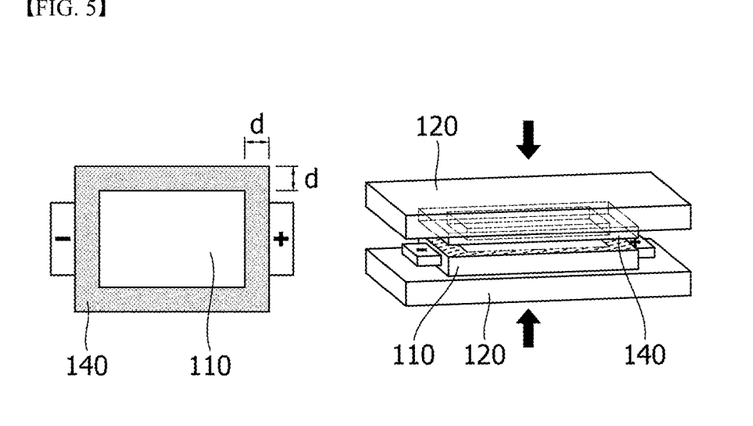

FIGS. 3 to 5 are schematic diagrams showing a pressing portion of the pressing pad according to an embodiment of the present invention. Referring to FIGS. 3 to 5, a portion where the pressure pad contacts the battery cell is a part of the body part of the battery cell, and is the edge portion of the body corner where the damage on the separator frequently occurs. FIGS. 3 to 5 illustrate that the pressure pad is attached to only one side of the plate, but is not limited thereto, and may be attached to both sides of the plate.

The portion in which the pressing panel is in contact with the battery cell may have a form which is extended in a direction orthogonal to the direction in which the electrode terminals extend while having a predetermined width d, that is, the width direction of the battery cell, at the portion where the electrode terminals at both ends of the battery cell body are located as in FIG. 3. Alternatively, it may also have a form that is extended in a longitudinal direction of the battery cell body part as in FIG. 4. Alternatively, it may have a form of a rectangular ring having a predetermined width d and a gap formed in the center portion thereof as in FIG. 5.

In addition, a pressure pad of the type shown in FIGS. 3 to 5 may be attached to one side of the pressing panel, and a pressure pad having a cuboid shape capable of pressing the entire area of the battery cell body part may be attached to another side of the pressing panel.

The shape and size of the pressure pad will be determined according to the size of the battery cell to be inspected and the size and location of the defects of the separator, but in the embodiment of the present invention, the pressure pad has a cuboid shape having a constant width d. Referring to FIGS. 3 to 5, the pressure pad may have a shape of a long cuboid having a constant width d.

In this case, the width d is preferably at least 2 cm, more preferably 2 to 4 cm. When the width of the pressure pad is less than 2 cm, there is a limitation in defect detection due to insufficient pressurization on a portion of the battery cell in which a separator defect may occur.

In addition, the pressure pad may have a thickness of 1 to 10 mm, preferably 3 to 9 mm, more preferably 5 to 8 mm. The thickness may be defined as the length of the pressure pad corresponding to the distance from the plate to the battery cell. When the thickness of the pressure pad is too small, it is not easy to effectively press the defective part, and when the thickness is too large, the edge of the battery cell may be damaged.

The length of the pressure pad is sufficient if it corresponds to the width of the battery cell to be inspected or the length of the battery cell to be inspected. Referring to FIG. 3, the length of the pressure pad is a length corresponding to the width of the battery cell. Referring to FIG. 4, the length of the pressure pad is a length corresponding to the length of the battery cell.

In addition, the material of the pressure pad is not particularly limited. However, when materials with too low hardness are used, as the pressure pad is elongated, its appearance may be damaged by the elongation of the cell pouch. Therefore, elastic natural rubber or synthetic polymer material is preferable, and in particular, a polyurethane-based polymer material is preferable because it can effectively press the battery cell.

The step of measuring open circuit voltage (OCV) of the battery cell to be inspected may be additionally included before, during or after pressing the activation jig (S300), and this step is for setting the range of the applied voltage in applying the constant voltage in the step of inspecting the current (S400) thereafter. Since pressurization of the battery cell does not affect the voltage of the battery cell, the voltage of the battery cell to be inspected is to be measured be before the current inspection. The measuring of the voltage of the battery cell may be performed before pressing the battery cell by the activation jig. It may also be performed while pressing by the activation jig. It may also be performed before inspecting the current after pressurization.

Next, by performing a current inspection step (S400) of the battery cell, the defect caused by the defect of the separator of the battery is detected. Specifically, the current inspection step (S400) includes a step of applying a voltage to the battery cell (S410); and a step of detecting a separator defect by measuring a leakage current (S420).

The step of inspecting the current (S400) is as follows. In the step (S410) of applying the voltage, constant voltage (CV) is applied. In the step (S420) of measuring the leakage current, the average for the leakage current values, which are measured for 2 to 10 seconds in real time, is calculated, and when the average value exceeds the reference value, it is determined as a defective battery cell due to a separator defect.

Figure 9:
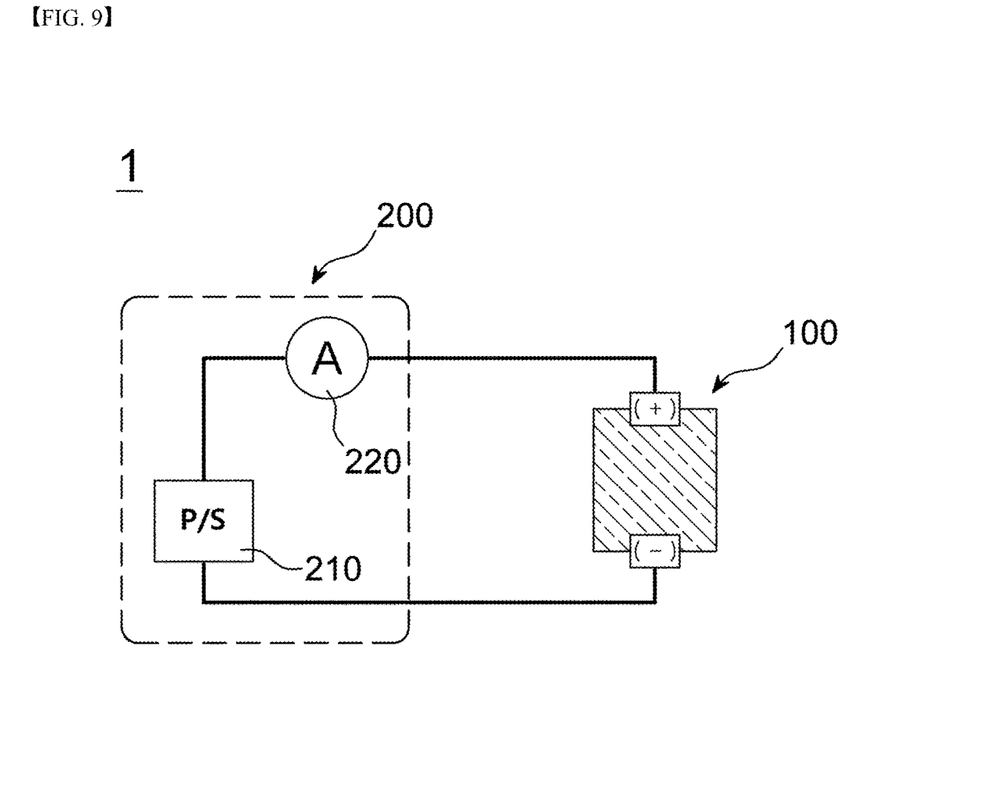
FIG. 9 is a schematic diagram showing a pressure short circuit inspection device 1 including an inspection equipment 200 for performing current inspection of the present invention.

In the step of inspecting the current (S400), it is determined whether the battery cell is defective by measuring the current flowing through the battery cell internal resistance component when voltage is applied. To this end, the electrode terminal of each of the plurality of battery cells accommodated in the activation jig is connected to the current inspection equipment. Referring to FIGS. 6 and 9, the activation jig 100 and the current inspection equipment 200 on which the plurality of battery cells are mounted are electrically connected to each other.

FIG. 9 shows an inspection equipment 200 according to an embodiment of the present invention. Referring to this, the inspection equipment 200 includes a power system 210 for applying a voltage to a battery cell as an equipment for performing a current inspection of the pressurized battery cell; and a current measuring device 220 for measuring an over leakage current.

The power system 210 may include a voltage generation unit for generating a voltage for applying a voltage to a plurality of battery cells, and a connection terminal which is connected to the electrode lead of each battery cell to connect the voltage supplied from the voltage generation unit to each battery cell.

The current measuring device 220 measures the leakage current flowing through the battery cell to which the voltage is applied by the power system 210. After applying a voltage to the battery cell, the current measuring device 220 can determine whether there is leakage current by directly measuring the leakage current, thereby detecting a defective battery cell.

The range of the applied voltage may be from the open circuit voltage of the battery cell measured in the previous step to the open circuit voltage+500 μV, preferably from the open circuit voltage to the open circuit voltage+50 μV, and most preferably from the open circuit voltage to the open circuit voltage+20 μV. When the value of the applied voltage exceeds the open circuit voltage+500 μV, the battery cell is charged, resulting in a small rate of change of voltage per capacity. Accordingly, as the graph type of current according to time is changed or the current rises greatly in the beginning, it takes a long time for the current to be stabilized, which is not desirable.

When the constant voltage is applied to the battery cell as described above, a battery cell, in which an internal short circuit occurs due to pressurization, needs more current to maintain the applied voltage, thereby having a leakage current greater than that of a normal battery cell. Therefore, according to the inspection method of the present invention, it is possible to identify battery cells, whose measured leakage current exceeds a predetermined reference value, as defective battery cells due to a separator defect.

The average value of the leakage currents measured for 2 to 10 seconds is used as the leakage current value. Specifically, by comparing the current average value measured for 2 to 10 seconds with the predetermined reference value, it is possible to identify defective battery cells due to the separator defect.

In an embodiment of the present invention, 0.08 mA was set as a defect reference value, and a battery cell having an average leakage current exceeding 0.08 mA was detected as a defective battery cell. In this embodiment, the accuracy of detection was nearly 100%. In addition, according to an embodiment of the present invention, when the pressure applied by the pressure jig increases, the current value difference between a good battery cell and a defective battery cell may increase to 0.1 mA or more.

Conventionally, in order to detect a low voltage failure battery cell, it was determined whether a secondary battery is defective through a voltage drop (dOCV) value which is generated by comparing an open voltage (OCV) difference at two different time points with a reference value. The inspection through this voltage drop was limited in efficiency because it took more than 30 minutes. On the other hand, according to the inspection method of the present invention, it is possible to detect a defective battery cell due to a separator defect within a few seconds to several tens of seconds, thereby improving productivity, and the inspection method is less affected by temperature compared to the method through the voltage drop, which is an advantage.

Hereinafter, a battery cell to which the inspection method of the present invention is applied will be described in detail.

Battery cells may be classified according to the type of electrode assembly having an electrode and a separator interposed therebetween. Representative examples of the electrode assembly include a jelly-roll (wound) electrode assembly having a structure in which a long sheet type positive electrode and a negative electrode are interposed and wound in a separator, a stack type electrode assembly having a structure in which a plurality of positive and negative electrodes cut in a predetermined size unit are sequentially stacked with a separator interposed therebetween, and a stack-folding electrode assembly having a structure in which unit cells, such as bi-cells or full cells, are wound with a separation film in a state in which positive and negative electrodes of a predetermined unit are interposed with a separator. Among these, in the case of the stack-folding electrode assembly, the separation film or the separator may be damaged due to various causes such as carelessness or error in the process of assembling the electrode assembly with the separation film. Typically, tearing, folding, and puncture of the separator may occur. As such, part of the electrode surface may be exposed from the separator, and if pressurization occurs in the portion by the thickness of the separator without a contact between the positive electrode and the negative electrode, an internal short circuit may occur. Such a separator defect may cause battery performance degradation, explosion, and the like by the contact between the positive electrode and the negative electrode at the interface.

In the case of tearing of the separator detected by the inspection method of the present invention, effective detection is possible when the area is more than 0 and 26.0 mm$^2$, preferably 2.0 to 4.5 mm$^2$.

In general, a battery cell may be a lithium secondary battery, and a general lithium secondary battery includes a positive electrode, a negative electrode, a separator, and an electrolyte.

The positive electrode, for example, may be prepared by applying a mixture of a positive electrode active material, a conductive material and a binder on a positive electrode current collector, followed by drying. If necessary, a filler may be further added to the mixture.

The positive electrode active material may be a layered compound such as lithium cobalt oxide (LiCoO$_2$), lithium nickel oxide (LiNiO$_2$), or a compound substituted with one or more transition metals; lithium manganese oxides such as Li$_{1+x}$Mn$_{2-x}$O$_4$ (herein, x is between 0 and 33), LiMnO$_3$, LiMn$_2$O$_3$, and LiMnO$_2$; lithium copper oxide (Li$_2$CuO$_2$); vanadium oxides such as LiV$_3$O$_8$, LiFe$_3$O$_4$, V$_2$O$_5$, and Cu$_2$V$_2$O$_7$; lithium nickel oxide expressed by LiNi$_{1-x}$M$_x$O$_2$ (herein, M=Co, Mn, Al, Cu, Fe, Mg, B or Ga, and x=0.01 to 0.3); a lithium manganese compound oxide expressed by LiMn$_{2-x}$M$_x$O$_2$ (where M=Co, Ni, Fe, Cr, Zn or Ta, and x=0.01 to 0.1) or Li$_2$Mn$_3$MO$_8$ (where M=Fe, Co, Ni, Cu or Zn); LiMn$_2$O$_4$ in which a part of Li is substituted with an alkaline earth metal ion; disulfide compounds; Fe$_2$(MoO$_4$)$_3$, etc., but not limited thereto.

The conductive material is usually added in an amount of 1 to 30% by weight based on the total weight of the mixture including the positive electrode active material. Such a conductive material is not particularly limited as long as it has electrical conductivity without causing a chemical change in the battery, and examples thereof include graphite such as natural graphite and artificial graphite; carbon black such as carbon black, acetylene black, Ketjen black, channel black, furnace black, lamp black, and summer black; conductive fibers such as carbon fiber and metal fiber; metal powders such as carbon fluoride, aluminum and nickel powder; conductive whiskey such as zinc oxide and potassium titanate; conductive metal oxides such as titanium oxide; and conductive materials such as polyphenylene derivatives and the like.

The binder is added in an amount of 1 to 30% by weight, on the basis of the total weight of the mixture containing the positive electrode active material, as a component that assists in bonding between the active material and the conductive material and bonding to the current collector. Examples of such binders include polyvinylidene fluoride, polyvinyl alcohol, carboxymethylcellulose (CMC), starch, hydroxypropylcellulose, regenerated cellulose, polyvinylpyrrolidone, tetrafluoroethylene, polyethylene, polypropylene, ethylene-propylene-diene terpolymer (EPDM), sulfonated EPDM, styrene butylene rubber, fluorine rubber, various copolymers and the like.

The filler is optionally used as a component for inhibiting expansion of a positive electrode, and is not particularly limited as long as it is a fibrous material without causing a chemical change in the battery. Examples of the filler include olefin polymers such as polyethylene and polypropylene; fibrous materials such as glass fibers and carbon fibers.

Further, the negative electrode may be formed by coating a negative electrode active material on a negative electrode collector and drying the negative electrode active material. Optionally, the negative electrode may further include the above-described components.

Examples of the negative electrode active material include carbon such as non-graphitized carbon and graphite carbon; metal complex oxide such as Li$_x$Fe$_2$O$_3$ (0≤x≤1), Li$_x$WO$_2$ (0≤x≤1), Sn$_x$Me$_{1-x}$Me'$_y$O$_z$ (Me: Mn, Fe, Pb, Ge; Me': Al, B, P, Si, groups 1, 2, and 3 of the periodic table, halogen; 0<x≤1; 1≤y≤3; 1≤z≤8); lithium alloy; silicon alloy; tin alloy; metal oxides such as SnO, SnO$_2$, PbO, PbO$_2$, Pb$_2$O$_3$, Pb$_3$O$_4$, Sb$_2$O$_3$, Sb$_2$O$_4$, Sb$_2$O$_5$, GeO, GeO$_2$, Bi$_2$O$_3$, Bi$_2$O$_4$, and Bi$_2$O$_5$; conductive polymers such as polyacetylene; and Li—Co—Ni-based materials.

The separator is interposed between the positive electrode and the negative electrode, and an insulating thin film having high ion permeability and mechanical strength is used. The pore diameter of the separator is generally 0.01 to 10 micrometers, and the thickness is generally 5 to 300 micrometers. Examples of such a separator include olefin-based polymers such as polypropylene which is chemically resistant and hydrophobic; a sheet or a nonwoven fabric made of glass fiber, polyethylene or the like. When a solid electrolyte such as a polymer is used as the electrolyte, the solid electrolyte may also serve as a separator.

The electrolyte consists of a polar organic electrolyte and a lithium salt. A non-aqueous liquid electrolyte, an organic solid electrolyte, an inorganic solid electrolyte, and the like are used as the electrolyte.

Examples of the non-aqueous liquid electrolyte include N-methyl-2-pyrrolidinone, propylene carbonate, ethylene carbonate, butylenecarbonate, dimethyl carbonate, diethyl carbonate, gamma-Butyrolactone, 1,2-dimethoxyethane, tetrahydroxyfuran, 2-methyltetrahydrofuran, dimethylsulfoxide, 1,3-dioxolane, formamide, dimethylformamide, dioxolane, acetonitrile, nitromethane, methyl formate, methyl acetate, phosphoric acid triester, trimethoxymethane, dioxolane derivatives, sulfolane, methyl sulfolane, 1,3-dimethyl-2-imidazolidinone, propylene carbonate derivatives, tetrahydrofuran derivatives, ethers, methyl pyrophosphate, ethyl propionate, etc.

Examples of the organic solid electrolyte include a polymer electrolyte such as a polyethylene derivative, a polyethylene oxide derivative, a polypropylene oxide derivative, a phosphate ester polymer, an agitation lysine, a polyester sulfide, a polyvinyl alcohol, a polyvinylidene fluoride, a polymer including an ionic dissociation group, and the like.

Examples of the inorganic solid electrolyte include nitrides, halides, and sulfates of Li such as Li$_3$N, LiI, Li$_5$NI$_2$, Li$_3$N—LiI—LiOH, LiSiO$_4$, LiSiO$_4$—LiI—LiOH, Li$_2$SiS$_3$, Li$_4$SiO$_4$, Li$_4$SiO$_4$—LiI—LiOH, and Li$_3$PO$_4$—Li$_2$S—SiS$_2$.

The lithium salt is a substance that is soluble in the non-aqueous electrolyte. The examples of the lithium salt include LiCl, LiBr, LiI, LiClO$_4$, LiBF$_4$, LiB$_{10}$Cl$_{10}$, LiPF$_6$, LiCF$_3$SO$_3$, LiCF$_3$CO$_2$, LiAsF$_6$, LiSbF$_6$, LiAlCl$_4$, CH$_3$SO$_3$Li, CF$_3$SO$_3$Li, (CF$_3$SO$_2$)$_2$NLi, chloroborane lithium, lower aliphatic carboxylic acid lithium, lithium 4-phenylborate, imide and the like.

For the purpose of improving charge/discharge characteristics, flame retardancy, etc., pyridine, triethylphosphite, triethanolamine, cyclic ether, ethylenediamine, n-glyme, hexaphosphoric triamide, nitrobenzene derivative, sulfur, quinone imine dye, N-substituted oxazolidinone, N-substituted imidazolidine, ethylene glycol dialkyl ether, ammonium salt, pyrrole, 2-methoxyethanol, aluminum trichloride, etc. may be added to the non-aqueous electrolyte. In some cases, a halogen-containing solvent such as carbon tetrachloride or ethylene trifluoride may be further added to impart nonflammability, or a carbon dioxide gas may be further added to improve high temperature storage characteristics.

Hereinafter, the present invention will be described in detail with reference to examples. However, the embodiments according to the present invention may be modified into various other forms, and the scope of the present invention should not be construed as being limited to the examples described below. The examples of the present invention are provided to more fully describe the present invention to those skilled in the art.

Reference Example

The stack-folding cell electrode assembly having the configuration of the bi-cell was accommodated in a pouch-type battery container of a laminate sheet and filled with an electrolyte, and then the battery container was sealed to manufacture a battery cell.

Preparation Example 1

A battery cell was manufactured in the same manner as in Reference Example except that a defect is added so that the total torn area is 2.0 mm$^2$ at corners of both ends of the separator to which the folding tool Gripper comes into contact in the gap separator between the first bi-cell and the second bi-cell, which unfolds the stack-folding cell electrode assembly and starts folding.

Preparation Example 2

A battery cell was manufactured in the same manner as in Preparation Example 1, except that a defect was added such that the total tear area was 4.5 mm$^2$.

Preparation Example 3

A battery cell was manufactured in the same manner as in Preparation Example 1 except that a defect was added such that the total tear area was 26.0 mm$^2$.

Example 1

Ten battery cells manufactured as in Reference Example and Preparation Examples 1 to 3, respectively, were prepared and they were pre-aged at room temperature. The activation jig as shown in FIG. 6 is prepared on the third day of pre-aging, and an activation jig 100 having a pressure pad made of a thermoplastic polyurethane (PU) material having a width of 2.5 cm was prepared at the position that can press the edge of the both ends where the electrode terminal of the battery cell is located as in FIG. 3 in the pressing plate.

Thereafter, the pre-aged battery cells are accommodated in a space between the plates of the activation jig, and each electrode terminal of each accommodated battery cell was connected to the inspection equipment 200 to correspond to the polarity for the current inspection.

Thereafter, the pressing plate was advanced by the pressure driving unit of the activation jig to pressurize the battery cell to a pressure of 2.83 MPa, and the open circuit voltage of the battery cell was measured during the pressurization. The average of the open circuit voltage of the measured battery cell was 279 mV. After that, a constant voltage of 279.10 mV, which is larger by 10 mA, is applied, and the leakage current values according to time are shown in FIG. 10 by measuring the leakage current for 10 seconds.

Example 2

Figure 11:
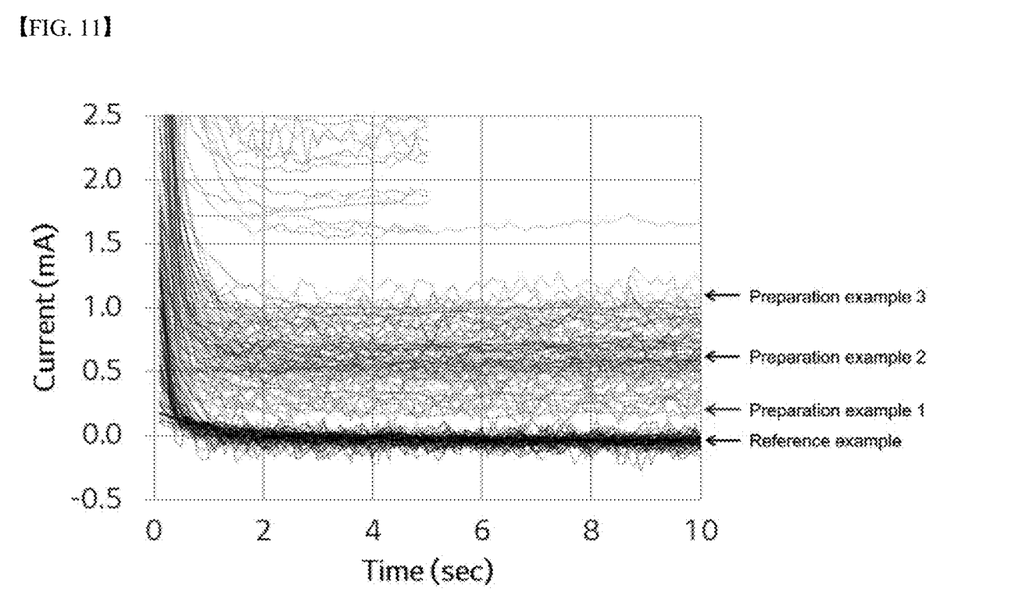

When pressurizing the battery cell by the activating jig in Example 1, pressurization and current measurements were performed in the same manner as in Example 1 except that the pressure was set as 3.34 MPa, and the leakage current values over time were shown in FIG. 11.

Figure 10:
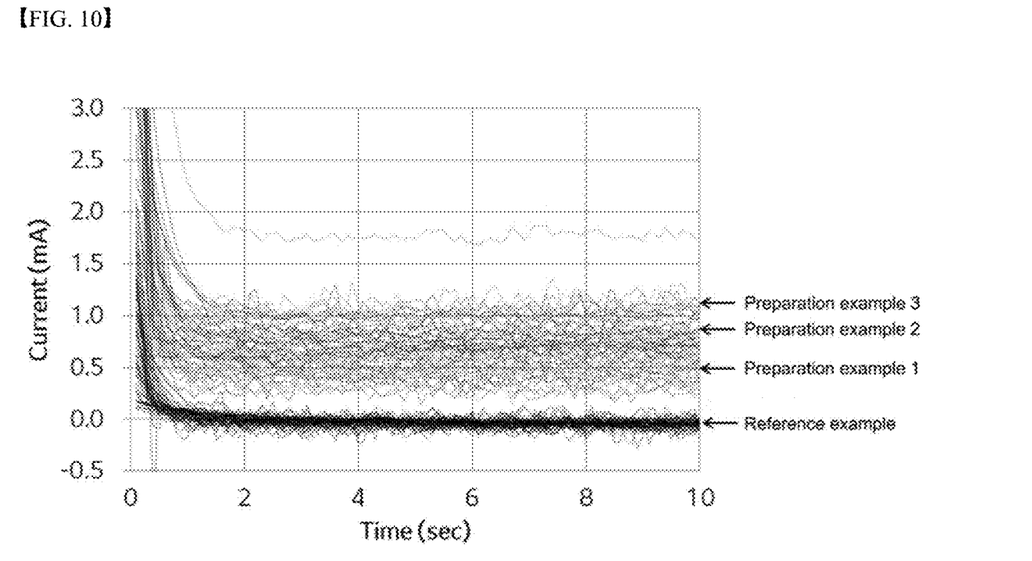
FIGS. 10 and 11 are graphs of leakage current over time measured in accordance with one embodiment of the present invention.

FIGS. 10 and 11 are graphs showing that in the battery cells of Reference Examples and Preparation Examples 1 to 3, a current rapidly increases immediately after voltage is applied, and then the current converges to a constant value and stabilizes. In detail, it can be seen that the battery cell of the reference example without the separator defect has a leakage current of 0 mA regardless of the applied pressure. On the other hand, in the case of the battery cells of Preparation Examples 1 to 3 with a damage of the separator tearing, the leakage current is stabilized to a constant value of more than 0 mA. This may be because the internal short circuit is caused in a battery cell with a damage on the separator by pressurization, and leakage current is generated in the internal short circuit. In addition, it can be seen that in the case of Example 2 in which the pressing force was increased in the battery cells of Preparation Examples 1 to 3, the leakage current was further increased.

Figure 12:
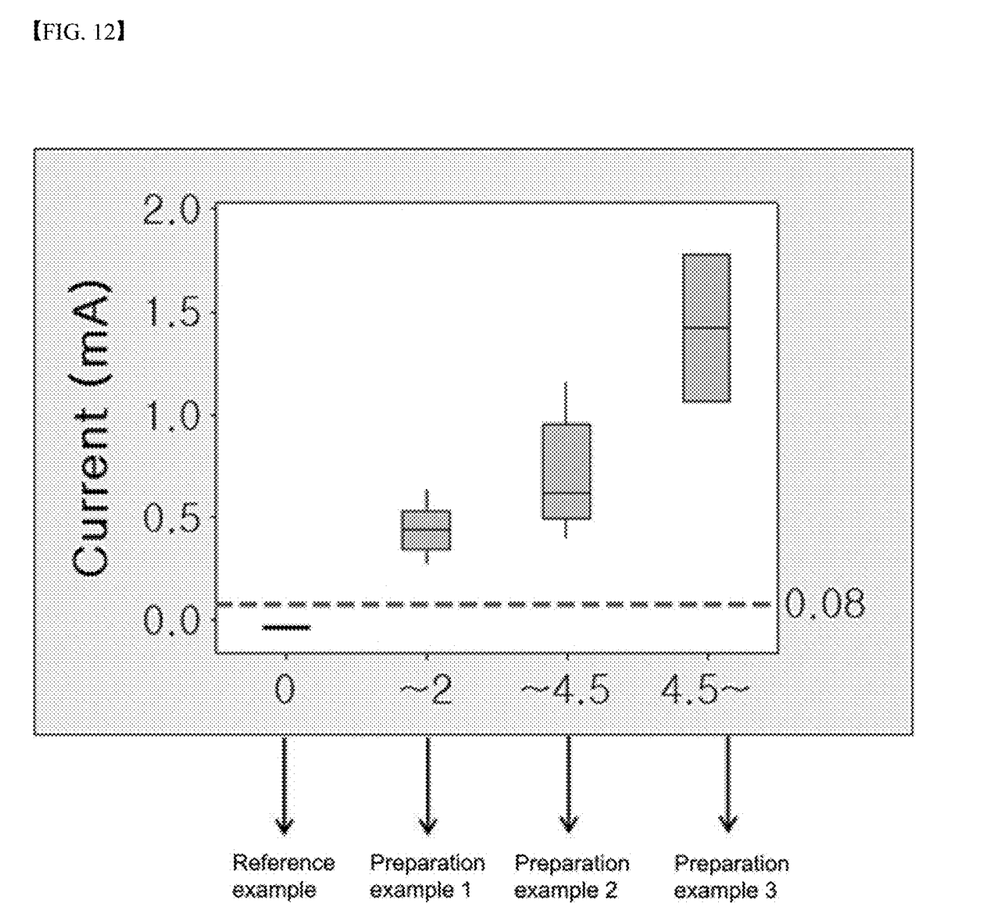
FIG. 12 shows leakage current range values for respective separator defect sizes according to an embodiment of the present invention.

Moreover, when the pressure at the time of pressurization by an activation jig was 2.83 Mpa, the average value of the leakage currents measured for 2 to 10 second was calculated. The distribution of the average leakage current values according to the area of the separator defect was shown in FIG. 12. Referring to FIG. 12, it can be seen that the leakage current increases as the torn area of the separator increases. This is presumably because the larger the torn area of the separator, the greater the amount of current application, and the higher the leakage current.

Figure 13:
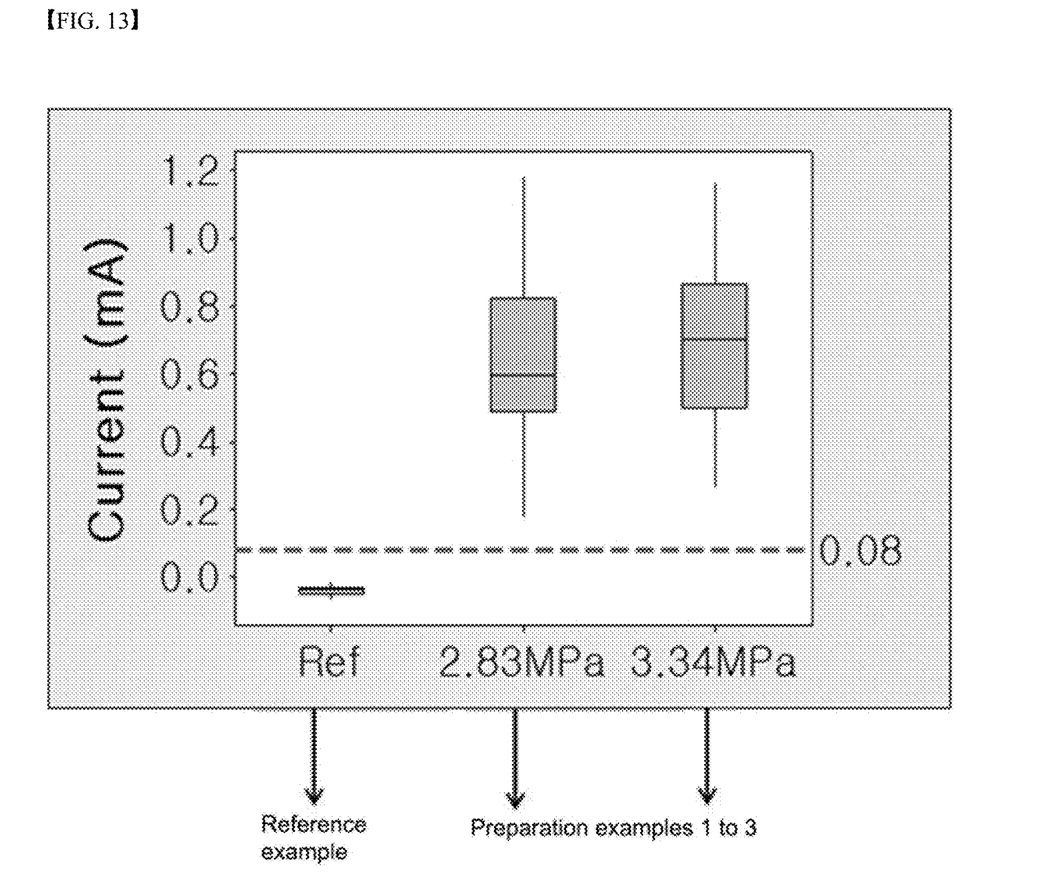
FIG. 13 shows leakage current range values for respective pressures according to an embodiment of the present invention.

In addition, the distribution diagrams of the average leakage current values according to the pressures of the battery cells of Reference Examples and Production Examples 1 to 3 are shown in FIG. 13. Referring to FIG. 13, it can be seen that the battery cell of the reference example has a leakage current of 0 mA under both pressure conditions of 2.83 MPa and 3.34 MPa. On the other hand, in the battery cells of Preparation Examples 1 to 3 with a defective separator, the leakage current exceeded 0.08 mA under both pressure conditions of 2.83 MPa and 3.34 MPa, and the leakage current distribution under the pressure condition of 3.34 MPa was slightly higher than the leakage current distribution under the pressure condition of 2.83 MPa.

As described above, according to the pressure short circuit inspection method of the present invention, it is possible to accurately detect low voltage failure battery cells due to a separator defect by inducing an internal short circuit by pressing the battery cells and measuring leakage current values generated through current inspection.

It will be understood by those skilled in the art that various changes in form and details may be made therein without departing from the spirit and scope of the invention as defined by the appended claims.

DESCRIPTION OF REFERENCE NUMERALS

1: pressure short circuit inspection device
10: positive electrode current collector
20: positive electrode mixture
30: separator
40: negative electrode mixture
50: negative electrode current collector
60: short circuit area by pressurization
100: activation jig
110: battery cell
120: plate
130: pressure jig 140: pressure pad
150: load cell
160: spring
200: inspection equipment
210: power system
220: current measuring device

The invention claimed is:

1. A method for detecting a short circuit, the method comprising:
    preparing a plurality of battery cells, each battery cell including an electrode assembly in which a positive electrode and a negative electrode are stacked in a battery container with a separator interposed therebetween and an electrolyte, wherein the battery container is sealed;
    pre-aging the plurality of battery cells,
    after pre-aging the plurality of battery cells, providing the plurality of battery cells in an activation jig;
    pressing the activation jig; and
    inspecting a current of the battery cells.

2. The method of claim 1, wherein the method is performed before a first formation process.

3. The method of claim 1, further comprising: measuring an open circuit voltage (OCV) of the battery cell before, during or after pressing the activation jig.

4. The method of claim 1, wherein inspecting the current of the battery cells comprises:
    applying a constant voltage to the battery cell; and
    detecting a separator defect by measuring a leakage current.

5. The method of claim 4, wherein a range of the applied voltage is from an open circuit voltage of the battery cell to the open circuit voltage of the battery cell+500 μV.

6. The method of claim 5, wherein the range of the applied voltage is from the open circuit voltage of the battery cell to the open circuit voltage of the battery cell+50 μV.

7. The method of claim 4, wherein detecting the separator defect includes measuring the leakage current for 2 to 10 seconds.

8. The method of claim 7, wherein it is determined that there is a separator defect when an average value of the measured leakage current exceeds 0.08 mA.

9. The method of claim 8, wherein the separator defect includes a tearing, a folding or a puncture of the separator.

10. The method of claim 9, wherein an area of the tearing of the separator is greater than 0 mm$^2$ and less than 26.0 mm$^2$.

11. The method of claim 9, wherein an area of the tearing of the separator is greater than 2.0 mm$^2$ and less than 4.5 mm$^2$.

12. The method of claim 1, wherein a state of charge (SOC) of the battery cell to be inspected is 10% or less.

13. The method of claim 1, wherein, in pressing the activation jig, the pressing force is between 1 MPa to 5 MPa.

14. The method of claim 1, wherein, in pressing the activation jig, the pressing force is between 2.83 MPa to 3.34 MPa.

15. The method of claim 1, wherein the pressing the activation jig includes pressing the battery cell by a pressure pad attached to the activation jig.

16. The method of claim 15, wherein a portion where the pressure pad contacts the battery cell is an edge portion of a body part of the battery cell.

* * * * *